United States Patent
Nychka et al.

(10) Patent No.: US 11,573,622 B2
(45) Date of Patent: Feb. 7, 2023

(54) DISCRETE POWER CONTROL OF COMPONENTS WITHIN A COMPUTER SYSTEM

(71) Applicant: TEXAS INSTRUMENTS INCORPORATED, Dallas, TX (US)

(72) Inventors: Robert J. Nychka, Wills Point, TX (US); Laurent Geffroy, Saint Laurent du Var (FR); Vipin Verma, Karnataka (IN); Sonu Arora, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 213 days.

(21) Appl. No.: 16/441,294

(22) Filed: Jun. 14, 2019

(65) Prior Publication Data

US 2019/0294232 A1    Sep. 26, 2019

Related U.S. Application Data

(60) Continuation of application No. 14/864,329, filed on Sep. 24, 2015, now Pat. No. 10,365,704, which is a
(Continued)

(30) Foreign Application Priority Data

Oct. 11, 2006  (EP) ..................................... 06291604

(51) Int. Cl.
*G06F 1/32*      (2019.01)
*G06F 1/3287*    (2019.01)
(Continued)

(52) U.S. Cl.
CPC .......... *G06F 1/3287* (2013.01); *G06F 1/3203* (2013.01); *G06F 1/3275* (2013.01); *G11C 11/4074* (2013.01)

(58) Field of Classification Search
CPC .... G06F 1/3287; G06F 1/3203; G06F 1/3275; G11C 11/4074
See application file for complete search history.

(56) References Cited

U.S. PATENT DOCUMENTS 4,959,780 A * 9/1990 Miyoshi .................. G06F 9/223
                                                  712/212
5,250,859 A * 10/1993 Kaplinsky ........ H03K 19/17704
                                                   326/40
(Continued)

FOREIGN PATENT DOCUMENTS

WO          2008010795 A1    1/2008

*Primary Examiner* — Zahid Choudhury
(74) *Attorney, Agent, or Firm* — Brian D. Graham; Frank D. Cimino

(57) ABSTRACT

Systems and methods for discrete power control of components within a computer system are described herein. Some illustrative embodiments include a system that includes a subsystem with a plurality of components (configurable to operate at one or more power levels), a control register (coupled to the plurality of components) including a plurality of bits (each uniquely associated with a one of the plurality of components), and a power controller coupled to, and configurable to cause, the plurality of components to operate at the one or more power levels. The power controller asserts a signal transmitted to the subsystem, commanding the subsystem to transition to a first power level. A first of the plurality of components, associated with an asserted bit of the control register, operates at a second power level corresponding to a level of power consumption different from that of the first power level indicated by the power controller.

20 Claims, 3 Drawing Sheets

Related U.S. Application Data division of application No. 11/870,562, filed on Oct. 11, 2007, now Pat. No. 9,146,600.

(51) Int. Cl.
*G11C 11/4074* (2006.01)
*G06F 1/3203* (2019.01)
*G06F 1/3234* (2019.01)

(56) References Cited

U.S. PATENT DOCUMENTS

| | | | | |
|---|---|---|---|---|
| 5,483,464 A * | 1/1996 | Song | ............... | G06F 1/3215 713/300 |
| 5,521,854 A | 5/1996 | Kadowaki et al. | | |
| 5,793,126 A * | 8/1998 | Gray | ............... | H01L 21/765 307/125 |
| 5,951,689 A * | 9/1999 | Evoy | ............... | G06F 9/3885 713/322 |
| 6,084,813 A * | 7/2000 | Kikuchi | ............... | G11C 11/4074 365/222 |
| 6,212,364 B1 * | 4/2001 | Park | ............... | H04W 52/346 455/69 |
| 6,608,476 B1 | 8/2003 | Mirov et al. | | |
| 6,731,548 B2 * | 5/2004 | Pax | ............... | G11C 5/04 365/189.12 |
| 7,437,575 B2 | 10/2008 | Dennis et al. | | |
| 7,631,199 B2 | 12/2009 | Kardach et al. | | |
| 8,291,251 B2 | 10/2012 | Rauschmayer et al. | | |
| 2002/0105845 A1 | 8/2002 | Hidaka | | |
| 2003/0226043 A1 | 12/2003 | Hicok | | |
| 2004/0260959 A1 | 12/2004 | Tani | | |
| 2005/0046400 A1 | 3/2005 | Rotem | | |
| 2005/0068062 A1 | 3/2005 | Yamasaki et al. | | |
| 2005/0125703 A1 | 6/2005 | Lefurgy et al. | | |
| 2005/0289373 A1 | 12/2005 | Chapuis et al. | | |
| 2006/0136755 A1 | 6/2006 | Qawami et al. | | |
| 2007/0041257 A1 | 2/2007 | Kim | | |
| 2008/0041562 A1 | 2/2008 | Gower et al. | | |
| 2019/0294232 A1 * | 9/2019 | Nychka | ............... | G06F 1/3203 |

\* cited by examiner

DISCRETE POWER CONTROL OF COMPONENTS WITHIN A COMPUTER SYSTEM

CROSS-REFERENCE TO RELATED APPLICATIONS

This application is a continuation of prior U.S. application Ser. No. 14/864,329, filed Sep. 24, 2015, which is a divisional of prior U.S. application Ser. No. 11/870,562, filed Oct. 11, 2007, now U.S. Pat. No. 9,146,600, which is a non-provisional application claiming priority to European Patent Office Application Serial No. EP 06291604.4, filed on Oct. 11, 2006, and entitled "Hybrid Power Control for Dynamic Low Power Domains." Each of these is hereby incorporated by reference in its entirety.

BACKGROUND

The proliferation of battery-operated portable electronic devices has resulted in an increased demand for improvements in the power efficiency of such devices. Many such devices now incorporate digital components that are capable of transitioning into and out of a variety of reduced power consumption states. Some computer systems, for example, may be capable of transitioning to a standby mode, wherein the processor is halted, but power is still provided to both the processor and the memory subsystem. Other systems may implement a sleep state, wherein the processor and other system components are powered down, but memory remains powered, either at full power or at a reduced power level. Still other systems may implement a hibernate state wherein the contents of the memory subsystem are saved to disk and the entire system is powered down. The saved contents of the memory subsystem may be used to restore the state of the system when the system is brought out of a hibernation state.

Many of the systems that are capable of multiple power states incorporate power control logic, sometimes in the form of a power controller state machine. The granularity of the control provided by such logic, however is limited to powering entire subsystems up or down, or reducing the power consumption of such subsystems by gating off a clock signal or by operating the subsystems at a reduced voltage (if the circuitry is designed for such low-voltage operation). Further, the transitions between power states are controlled by the power control logic, with no direct power control of individual subsystems available for access and control by software executing on a processor within the system.

SUMMARY

Systems and methods for discrete power control of components within a computer system are described herein. Some illustrative embodiments include a system that includes a subsystem including a plurality of components (each component configurable to operate at one or more of a plurality of power levels), a control register coupled to the plurality of components and including a plurality of bits (each bit uniquely associated with a single component of the plurality of components), and a power controller coupled to the plurality of components and configurable to cause the plurality of components to operate at the one or more of the plurality of power levels. The power controller asserts a signal transmitted to the subsystem, commanding the subsystem to transition to a first power level of the plurality of power levels. A first component of the plurality of components, associated with an asserted bit of the control register, operates at a second power level of the plurality of power levels corresponding to a level of power consumption different from that of the first power level indicated by the power controller.

Other illustrative embodiments include an integrated circuit that includes a processor core, a memory subsystem coupled to the processor core and including a plurality of memories, a control register coupled to the processor and the memory subsystem (the control register including a plurality of bits, each bit associated with one of the plurality of memories), and a power controller coupled to the processor and the memory subsystem (the power controller configurable to control the power state of at least part of the memory subsystem). The processor asserts a bit associated with a first memory of the plurality of memories, and the controller asserts a power control signal transmitted to the memory subsystem. The asserted bit causes at least part of the first memory to operate at a first power level, and the control signal asserted by the memory controller causes a second memory of the plurality of memories to operate at a second power level associated with a power consumption level different from that of the first power level.

Yet further illustrative embodiments include a method that includes configuring each of a subset of components of a subsystem to operate at a first power level, signaling (to at least the subset of components) a transition to a second power level in which the subsystem consumes power at a rate different from that consumed when operating at the first power level, and the subset of components operating at the first power level (the configuring of each subset overriding the signaling to transition to the second power level).

BRIEF DESCRIPTION OF THE DRAWINGS

For a detailed description of illustrative embodiments of the invention, reference will now be made to the accompanying drawings in which.

NOTATION AND NOMENCLATURE

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware and/or software components and may be used to refer to an electronic device, such as, for example an integrated circuit, a portion of an integrated circuit, a combination of integrated circuits, etc. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

Figure 1:
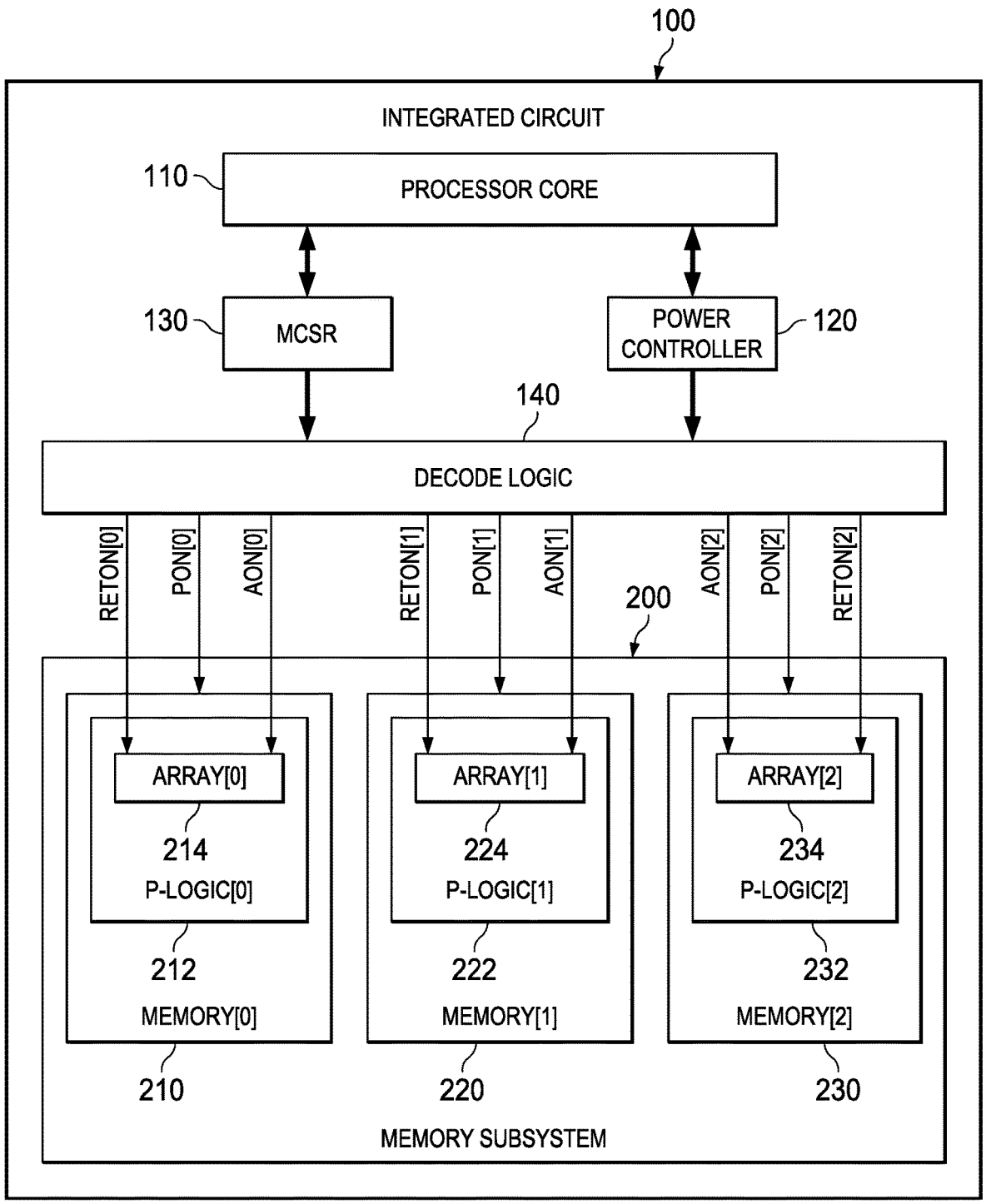
FIG. 1 shows a system incorporating individual power control of components of a memory subsystem, constructed in accordance with at least some illustrative embodiments.

Because of the complexity of modern computer systems, including systems on a chip or SoCs, it is not unusual for some subsystems within a system to be heavily utilized for a given time interval, while other subsystems are less utilized (or not utilized at all) during the same time interval. These subsystems group individual components that together operate as and define a functional block of the system (e.g., a memory subsystem, a graphics subsystem, and a direct memory access (DMA) subsystem). A significant power savings may be realized if, during the time intervals when portions or components of the subsystems are not being utilized, such subsystem portions or components are placed in a state that causes the subsystems to consume less power than when fully activated. FIG. 1 shows an integrated circuit (IC) 100 (e.g., an SoC) capable of placing at least some individual components of a subsystem within IC 100 (including components within a component) into a reduced power consumption state, in accordance with at least some illustrative embodiments. IC 100 includes processor core 110, which couples to both power controller 120 and memory control and status register (MCSR) 130. Power controller 120 and MCSR 130 each couples to decode logic 140. Decode logic 140 couples to memory subsystem 200, which includes memory[0] (210), memory[1] (220) and memory[2] (230). Each memory 210, 220 and 230 respectively includes P-Logic[0] (periphery logic 212), P-Logic[1] (222), and P-Logic[2] (232). Each memory further respectively includes array[0] (214), array[1] (224) and array[2] (234). As will be described below, power controller 120 permits control of power consumption at the subsystem level, while MCSR 130 permits control of power consumption at the subsystem component level.

Each of the components within each memory of the illustrative embodiment of FIG. 1 (i.e., the array and the periphery logic) are powered from separately controlled power sources or "rails," each of which is enabled by a control signal generated by decode logic 140. These control signals determine which component is powered on or off, and, in at least some embodiments, at which of several power levels a component is operated when it is not off. For example, the periphery logic within each memory in FIG. 1 may be selectively powered-up (full power) or powered-down (no power), independent of the power level at which the array of the memory is operated. The memory array within each memory may similarly be independently powered up or down, but may also be operated at one of two possible powered up, power consumption levels. At the first "full-power" level, the array is on and operating at full power. At the second "reduced-power" level, the array operates in a "retention" mode, in which the array is operated at a power consumption level lower than the power consumption level of the array during normal operation. By incorporating split power rails and individualized control of each subsystem component, power control of the system may be extended beyond the course control provided by a power controller external to the subsystem. A higher granularity power control of the system is achieved by integrating the control mechanisms into the architecture and design of the subsystems and the subsystem components.

Continuing to refer to FIG. 1, the lower "retention" level of power consumption of the array is achieved in at least some illustrative embodiments by operating the array at a reduced voltage level (while in the retention mode) that is just high enough for the individual memory cells to reliably retain the values stored within them. In other illustrative embodiments that utilize dynamic memory cells, a self-refresh mode may be enabled, by which refresh logic, powered by the same power rail as the array, provides the minimal periodic accesses necessary to maintain data integrity of the data stored within each memory cell of the array. Other techniques for operating the memory array in a reduced-power retention mode will become apparent to those of ordinary skill in the art, and all such techniques are within the scope of the present disclosure.

The control signals that determine the power levels of the components of memories[0-2] are generated by decode logic 140, and include: Array On signals 0 through 2 (AON[0-2]), which, when asserted, cause the array of each corresponding memory to operate at full power; Retention On signals 0 through 2 (RETON[0-2]), which, when asserted, cause the array of each corresponding memory to be operated at a reduced power; and Periphery On 0 through 2 (PON[0-2]), which, when asserted, cause the periphery logic to operate at full power. By combining these signals and the resulting power levels of the corresponding memory components, several modes of operations are defined for the illustrative embodiment of FIG. 1, as shown in Table 1.

TABLE 1

| Mode | Array On | Retention On | Periphery On |
| --- | --- | --- | --- |
| Active | Asserted (1) | De-Asserted (0) | Asserted (1) |
| Retention | Asserted (1) | Asserted (1) | De-Asserted (0) |
| Sleep | De-Asserted (0) | De-Asserted (0) | De-Asserted (0) |
| RTA/AOD | Asserted (1) | Asserted (1) | Asserted (1) |

Referring to Table 1, the Active mode of at least some illustrative embodiments is defined by an assertion of the Array On and Periphery On signals and a de-assertion of the Retention On signal. When a memory (e.g., memory [1] (220) of FIG. 1) is in the Active mode, the periphery logic and the array of the memory (e.g., P-Logic[1] (222) and Array[1] (224)) are both operated at full power. In the Active mode, the memory is operated and accessed normally. In the Retention mode, both the Array On and Retention On signals are asserted, while the Periphery On signal is de-asserted. In the Retention mode, the periphery logic is powered off, and the array is operated at a reduced power level. Data within the array cannot be accessed by other logic within IC 100 when the memory is in the Retention mode, but the data saved in the memory is retained and can be accessed by placing the memory into the Active mode.

In the Sleep mode of at least some illustrative embodiments, the Array On, Retention On and Periphery On are all de-asserted, and both the array and the periphery logic of the memory are powered-down. All data within the memory is lost once the memory is placed into the Sleep mode. In both the Retention-Till-Access (RTA) and the Active-On-Demand (AOD) modes the Array On, Retention On and Periphery On signals are all asserted. In both modes, the periphery logic is powered on, but the array is maintained in a retention mode until data is needed. When data is needed, the Retention On signal is de-asserted, transitioning the memory to an Active mode. The data can be accessed more quickly when transitioning from either an RTA or an AOD mode to an Active mode, when compared to transitioning from a Sleep mode to an Active mode. This is due to the fact that the periphery logic is already powered on in both the RTA and AOD modes, whereas when transitioning out of a Sleep mode a time delay is necessary, before accessing the array, in order to allow the periphery logic to stabilize upon being powered on.

Although the control signals that define each mode in at least some illustrative embodiments are in the same state for both the RTA and AOD modes, each represents a distinct mode within the context of power level of the rest of IC 100 of FIG. 1. When a memory is in the RTA mode, at least some of the other memories within memory subsystem 200 are in the Active mode. By selectively placing one or more unused memories into the RTA mode, the unused memories can be configured to consume less power when not needed, while still retaining data. When a memory is in the AOD mode, at least some of the other memories are in the Sleep mode. By placing the other, unused memories in a Sleep mode while placing in an AOD mode a memory used to store data that will be needed shortly (but not immediately), power can be conserved while still making needed data quickly available to a processor core when it is needed (e.g., without having to swap in a saved memory image from a non-volatile storage device, such as a hard disk, upon transitioning from the Sleep mode to the Active mode).

Figure 2:
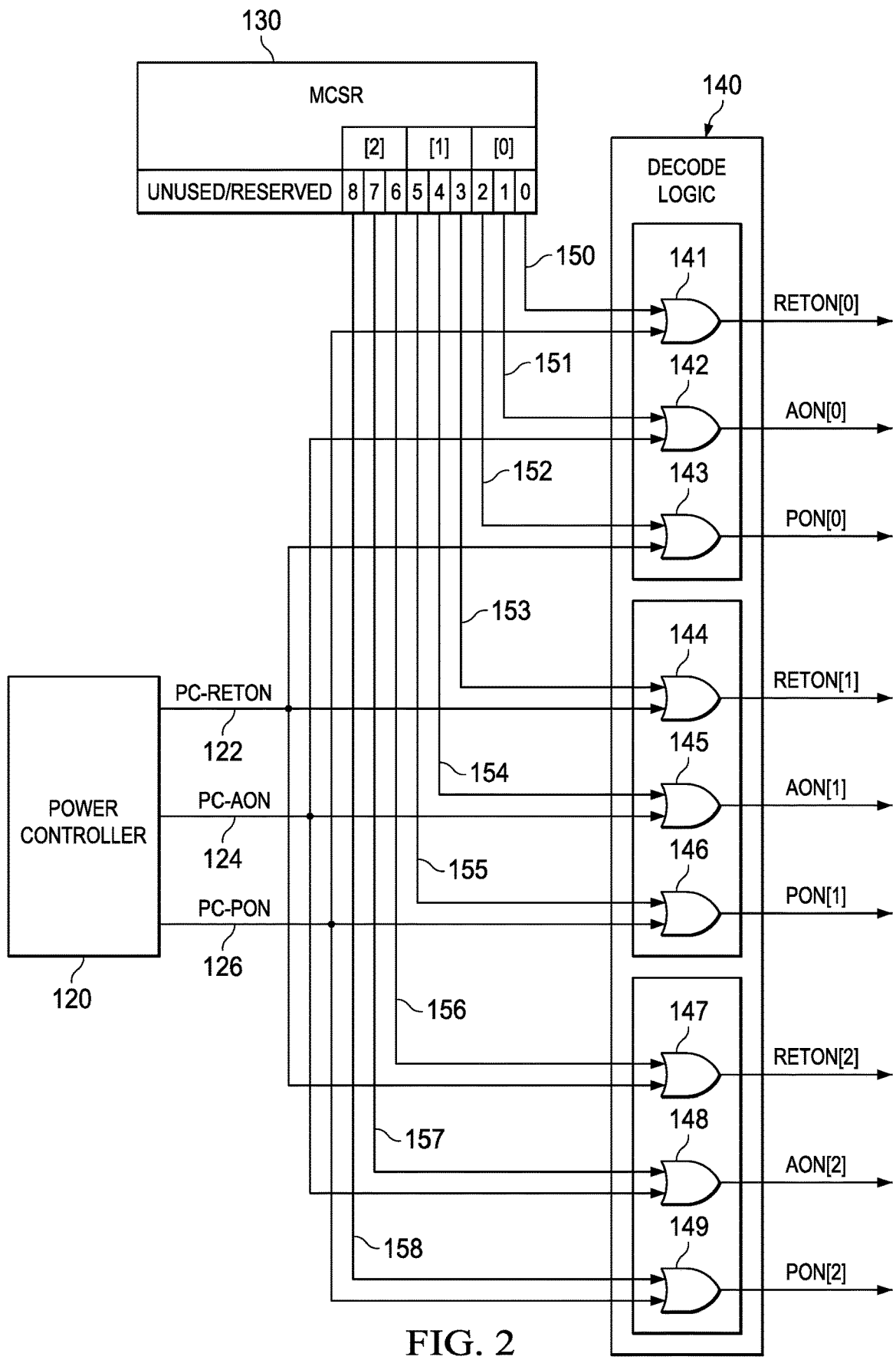
FIG. 2 shows the decode logic of FIG. 1, constructed in accordance with at least some illustrative embodiments.

In order to operate memories within memory subsystem 200 in the RTA and AOD modes, it is necessary to be able to individually control the power levels of each memory, and of individual components within each memory. In at least some illustrative embodiments, such individualized control is achieved by assigning a bit within MCSR 130 to each component within each memory, and then combining control signals representative of each bit with control signals from power controller 120, as shown in the illustrative embodiment of FIG. 2. The bits of MCSR 130 are organized in groups of three, each group associated with a memory ([0], [1] or [2]) within memory subsystem 200 of FIG. 1. The value of each bit within each group determines the state of a signal that controls the power level a component within the memory corresponding to the group. Thus, for example, bits 3, 4 and 5 of MCSR 130 of FIG. 2 respectively control the state of the Retention On[1] (RETON[1]) signal 153, Active On[1] (AON[1]) signal 154, and Periphery On[1] (PON[1]) signal 155, each corresponding to memory[1] (220) of FIG. 1. The PON[1] signal controls the power level of P-Logic[1] of FIG. 1, while the RETON[1] and AON[1] signals, in combination, control the power level of Array[1].

Referring again to FIG. 2, each individual control signal corresponding to the bits of MCSR 130 is combined with a control signal generated by power controller 120 using an OR gate, generating each of the three control signals used to determine the mode of operation of each memory. OR gates 141, 144 and 147 combine Power Controller Retention On (PC-RETON) signal 122 with MCSR 130 signals 150 (bit 0), 153 (bit 3) and 156 (bit 6). OR gate 141 generates the RETON[0] signal, OR gate 144 generates the RETON[1] signal, and OR gate 147 generates the RETON[2] signal. Similarly, OR gates 142, 145 and 148 combine Power Controller Active On (PC-AON) signal 124 with MCSR 130 signals 151 (bit 1), 154 (bit 4) and 157 (bit 7) to generate the AON[0], AON[1] and AON[2] signals respectively. Likewise, OR gates 143, 146 and 149 combine Power Controller Periphery On (PC-PON) signal 126 with MCSR 130 signals 152 (bit 2), 155 (bit 5) and 158 (bit 8) to generate the PON[0], PON[1] and PON[2] signals respectively.

Because logical OR gates are used to combine the signals, MCSR 130 provides the capability of overriding several of the modes of operation, as commanded by power controller 120, for individual memories within memory subsystem 200. For example, if power controller 120 commands memory subsystem 200 to enter a sleep mode (PC-RETON=PC-AON=PC-PON=0), software executing on processor core 110 of FIG. 1 can set bits within MCSR 130 to command individual memories within memory subsystem 200 to enter the Active, Retention, RTA or AOD modes of operation, overriding the command from power controller 120. Other logical gates and combinations of signals used to produce other overrides of either MCSR 130 over power controller 120, or power controller 120 over MCSR 130, will become apparent to those of ordinary skill in the art, and all such logical gates, logical combinations of signals and overrides are within the scope of the present disclosure.

As already noted, the bits within MCSR 130 are accessible and controllable by software executing on processor core 110 of FIG. 1. These bits enable software executing on processor core 110 to control the power consumption of IC 100 with a granularity not otherwise easily achievable using only power controller 120. Further, in at least some illustrative embodiments, because software executing on processor core 110 has access to a wide variety of status information related to the overall state of IC 100, the state of processor core 110, the state of individual subsystems and components within and coupled to IC 100, and the state of software executing on processor core 110, it is possible for software that controls the MCSR bits to assert and/or de-assert the bits based upon complex combinations of status and state information. Such combinations may be too complex to implement within power controller 120, or may require information not easily accessible by power controller 120 (e.g., program execution and state information readily available to an executive control program executing on processor core 110, such as an operating system).

For example, in at least some illustrative embodiments multiple software programs may be executing concurrently on processor core 110. Since only one program can execute at a time on a single core, each program is allocated a period of time or "time slice" in which to execute. In at least some illustrative embodiments, the allocation of a time slices is performed by the operating system under which the programs execute. Upon reaching the end of a time slice (or upon relinquishing a time slice if the program has no tasks to perform), a transition between the execution of one program and the execution of another program takes place, which is sometimes referred to as a context switch. During the context switch, the state of the system (e.g., processor core register values, interrupt mask values, and pipeline contents) are saved into memory for later retrieval when the current program next executes (i.e., the current program's next time slice). After saving the context of the current program that is being suspended, the context of the program that is about to resume (previously saved after completion of a prior time slice) is read from memory and the state of processor core 110 is restored.

To optimize the utilization and power management of memory subsystem 200, context information is saved in one memory, while program data is saved in another memory. This is to take advantage of the fact that context information is only needed during a context switch and not during the execution of a program during its time slice. In at least one illustrative embodiment, for example, the program data for both the suspending and resuming programs is maintained in memory[0] (210) of FIG. 1, while context information for both programs is maintained in memory[2] (230). Throughout the execution of both programs (including the context switch), power controller 120 commands an Active On mode of operation. Executive control software (e.g., an operating system) executing on the processor tracks the state of the suspending and resuming programs, and configures MCSR 130 such that the mode of operation of memory[2] (230) is overridden and set to operate in an RTA mode. Memory[2] (230) is subsequently maintained in reduced power level in between context switches, but is fully powered on during a context switch, when new context information is saved, and when previously saved context information is read. When the context switch occurs, the retention bit associated with memory[2] (which is in the RTA mode) is de-asserted by the executive control software, and memory[2] is transitioned to an active mode, thus "waking up" memory[2] and making the retained data available for use.

Although MCSR 130 is shown as a single, integrated control and status register, in at least some illustrative embodiments two separate registers may be used within MCSR 130, one for control and one for status, each mapped to a single address within the address space of processor core 110. Both writes and reads appear to processor core 110 as described above for an integrated control and status register, but the each status bits reflect the actual power state of each corresponding component rather than the state of the corresponding control bit. The state of a status bit, in a split or separate register configuration, may not transition to match the corresponding control bit until after a time delay, due to the time it takes to actually transition the power state of the corresponding component. By using separate status bits to indicate the actual power state of the component, rather than the commanded power state, it is possible to use the state of the status bit, or a transition of the state of the status bit, to trigger interrupts at processor core 110. These interrupts may be used, for example, to cause software executing on processor core 110 to respond to the actual change in the power state.

In other illustrative embodiments, the status bits of a split MCSR 130 may be combined with other status and control bits within a component or subsystem to detect command actions that are inconsistent with a power state. Thus, for example, if an attempt is made to access data in a memory that is in an RTA mode, the control bits used to access the data from memory may be combined with the status bits to produce an interrupt indicative of the attempted, erroneous access, causing execution of an exception handler on processor core 110. Other combinations of control and status signals and bits, and other responses to changes in such control and status signals and bits will become apparent to those of ordinary skill in the art, and all such bits, combinations, and responses are within the scope of the present disclosure.

Figure 3:
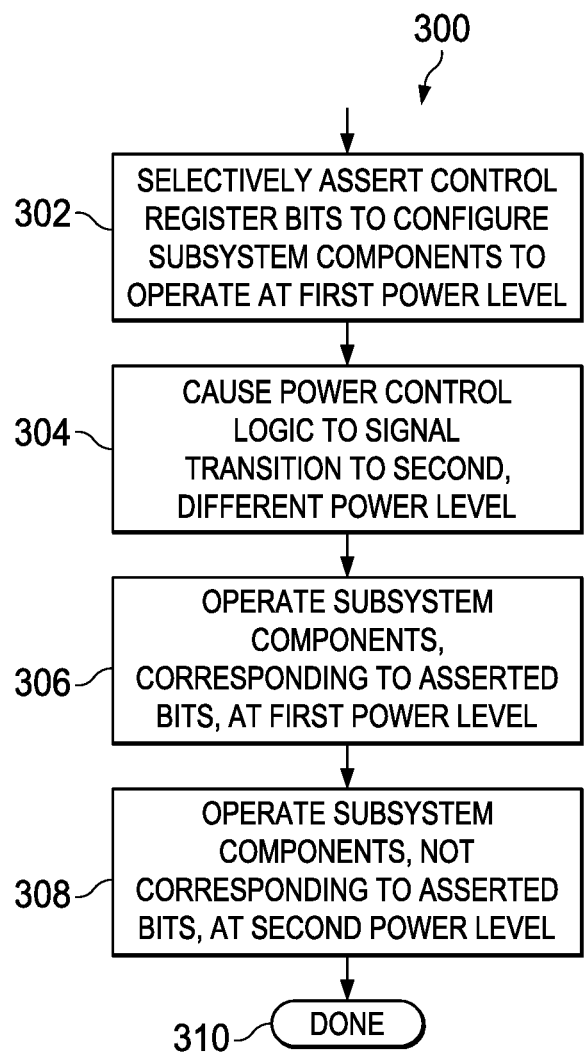
FIG. 3 shows a method for controlling power consumption of a computer system, in accordance with at least some illustrative embodiments.

FIG. 3 shows a method 300 for controlling the power consumption level of a subsystem, in accordance with at least some illustrative embodiments. One or more bits within a control register, each bit corresponding to a subsystem component, are asserted so as to configure the corresponding subsystem component to operate at a first power level (block 302). Power control logic (e.g., power controller 120 of FIG. 1) is operated so as to signal a transition to a second power level that is different from the first power level (block 304). The asserted bits cause the subsystem components corresponding to the asserted bits to operate at the first power level (block 306), while the subsystem components not corresponding to the asserted bits operate at the second power level (block 308), ending the method (block 310). The asserted bits thus override the power level, as commanded by the power control logic, of the components associated with the asserted bits.

The above disclosure is meant to be illustrative of the principles and various embodiments of the present invention. Numerous variations and modifications will become apparent to those skilled in the art once the above disclosure is fully appreciated. For example, although the embodiments shown and described include components incorporated into a single integrated circuit (e.g., an SoC), other illustrative embodiments include systems with discrete components (e.g., discrete processors, memories and power controllers) incorporated into separate integrated circuits, as well as integrated circuits with some components combined together on a one integrated circuit and other components incorporated into separate integrated circuits. Further, although only some memory technologies are described, the present disclosure is not limited to any specific memory technology, and all memory technologies capable of operating at a plurality of power levels are within the scope of the present disclosure. Also, though the illustrative embodiments of the present disclosure are directed to controlling a memory subsystem, embodiments that include other types of subsystems with components that can be operated at multiple power levels may be used to achieve the power consumption control described, and all such embodiments are within the scope of the present disclosure. It is intended that the following claims be interpreted to embrace all such variations and modifications.

What is claimed is:

1. An integrated circuit comprising:
 a power controller that includes a first power controller output and a second separate power controller output;
 a memory control circuit that includes a first memory control circuit output and a second separate memory control circuit output; and
 decode logic circuitry that includes:
  a first input coupled to the first power controller output;
  a second input coupled to the second separate power controller output;
  a third input coupled to the first memory control circuit output;
  a fourth input coupled to the second separate memory control circuit output; and
  a plurality of decode logic outputs, wherein the decode logic circuitry is to provide power control signals at the plurality of decode logic outputs based on the first power controller output, the second separate power controller output, the first memory control circuit output, and the second separate memory control circuit output.

2. The integrated circuit of claim 1, wherein the decode logic circuitry includes a logical OR circuit that couples at least one of the first power controller output and the second separate power controller and at least one of the first memory control circuit output and the second separate memory control circuit output to a third output of the plurality of decode logic outputs.

3. The integrated circuit of claim 1, wherein the decode logic circuitry is configured such that at least two outputs of the plurality of decode logic outputs are based on one of the first power controller output and the second separate power controller output.

4. The integrated circuit of claim 3, wherein:
the decode logic circuitry is coupled to provide the power control signals to a set of memory components; and
the first output of the plurality of power controller outputs corresponds to a plurality of memory components of the set of memory components.

5. The integrated circuit of claim 3, wherein the decode logic circuitry is configured such that a single output of the plurality of decode logic outputs is based on one of the first memory control circuit output and the second separate memory control circuit output.

6. The integrated circuit of claim 5, wherein:
the decode logic circuitry is coupled to provide the power control signals to a set of memory components;
the first output of the plurality of power controller outputs corresponds to each memory component of the set of memory components; and
the second output of the plurality of memory control circuit outputs corresponds to a single memory component of the set of memory components.

7. The integrated circuit of claim 1, wherein the memory control circuit includes a plurality of registers coupled to the plurality of memory control circuit outputs.

8. The integrated circuit of claim 1, wherein:
the plurality of decode logic outputs are coupled to a set of memory components;
a first output of the plurality of decode logic outputs corresponds to a first power level of a first memory component of the set of memory components; and
a second output of the plurality of decode logic outputs corresponds to a second power level of the first memory component of the set of memory components.

9. The integrated circuit of claim 8, wherein a third output of the plurality of decode logic outputs corresponds to the first power level of a second memory component of the set of memory components.

10. The integrated circuit of claim 8, wherein the second power level corresponds to reduced power consumption relative to the first power level.

11. An integrated circuit comprising:
a first power controller having a first power controller output and a second separate power controller output, the first power controller to provide a first power control signal on the first power controller output and to provide a second power control signal on the second separate power controller output;
a second power controller having a third power controller output and a fourth separate power controller output, the second power controller to provide a third power control signal on the third power controller output and to provide a fourth power control signal on the fourth separate power controller output; and
a decoder coupled to the first power controller and the second power controller to provide a third set of power control signals based on at least one of the first and second power control signals and on at least one of the third and fourth power control signals.

12. The integrated circuit of claim 11, wherein the second power controller includes a plurality of power control registers and is configured to provide the third and fourth power control signals based on the plurality of power control registers.

13. The integrated circuit of claim 11 further comprising a set of components coupled to receive the third set of power control signals.

14. The integrated circuit of claim 13, wherein at least one signal of the first and second power control signals corresponds to a power level of a plurality of components of the set of components.

15. The integrated circuit of claim 14, wherein each signal of the third and fourth power control signals corresponds to a power level of a single component of the set of components.

16. The integrated circuit of claim 11, wherein the decoder includes a plurality of logical OR circuits to provide the third set of power control signals based on at least one of the first and second power control signals and at least one of the third and fourth power control signals.

17. A method comprising:
receiving a first power control signal and a second separate power control signal, each signal of the first power control signal and the second separate power control signal corresponding to a plurality of components of a set of integrated circuit components;
receiving a third power control signal and a fourth separate power control signal, each signal of the third power control signal and the fourth separate power control signal corresponding to a single component of the set of integrated circuit components; and
providing a third set of power control signals to the set of integrated circuit components based on the first power control signal or the second separate power control signal and based on third power control signal or the fourth separate power control signal.

18. The method of claim 17, wherein the providing of the third set of power control signals is based on a logical OR operation of at least one of the first power control signal and the second separate power control signal with at least one of the third power control signal and the fourth separate power control signal.

19. The method of claim 17, wherein the providing of the third set of power control signals provides a plurality of signals of the third set of power control signals that are based on one of the first power control signal or the second separate power control signal.

20. The method of claim 17, wherein:
a first signal of the third set of power control signals corresponds to a first power level of a first component of the set of integrated circuit components; and
a second signal of the third set of power control signals corresponds to a second power level of the first component.

* * * * *